United States Patent [19]

Yamamoto

[11] Patent Number: 4,883,737

[45] Date of Patent: Nov. 28, 1989

[54] LIGHT-SENSITIVE MATERIAL CONTAINING SILVER HALIDE, REDUCING AGENT AND POLYMERIZABLE COMPOUND AND CONTAINING CORE/SHELL GRAINS DOPED WITH IRIDIUM

[75] Inventor: Soichiro Yamamoto, Kanagawa, Japan

[73] Assignee: Fuji Photo Film Co., Ltd., Kanagawa, Japan

[21] Appl. No.: 165,042

[22] Filed: Mar. 7, 1988

[30] Foreign Application Priority Data

Mar. 6, 1987 [JP] Japan .................. 62-51621

[51] Int. Cl.$^4$ .......................... G03C 1/72; G03C 1/44
[52] U.S. Cl. .................... 430/138; 430/270; 430/281; 430/367; 430/569
[58] Field of Search ............... 420/138, 220, 281, 292, 420/567, 569

[56] References Cited

U.S. PATENT DOCUMENTS

| | | | |
|---|---|---|---|
| 4,210,450 | 7/1980 | Corben | 430/567 |
| 4,419,442 | 12/1983 | Falxa et al. | 430/569 |
| 4,433,048 | 2/1984 | Solberg et al. | 430/434 |
| 4,439,520 | 3/1984 | Kofron et al. | 430/434 |
| 4,629,676 | 12/1986 | Hayakawa et al. | 430/203 |
| 4,722,884 | 2/1988 | Inoue et al. | 430/446 |
| 4,737,442 | 4/1988 | Yagihara et al. | 430/264 |
| 4,767,690 | 8/1988 | Yamamoto | 430/138 |
| 4,775,656 | 10/1988 | Harada et al. | 430/138 |

FOREIGN PATENT DOCUMENTS 203613 12/1986 European Pat. Off. .

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

A light-sensitive material comprises a light-sensitive layer provided on a support wherein the light-sensitive layer contains a silver halide grain, a polymerizable compound, a reducing agent and a color image forming substance. The polymerizable compound and color image forming substance are contained in microcapsules. The silver halide grain has a core/shell structure, and at least 90 mole % of halogen of the silver halide in the shell portion is iodine. The silver halide grain contains iridium ion in an amount of $10^{-7}$ to $10^{-3}$ mole based on one mole of the silver halide grain.

8 Claims, No Drawings

LIGHT-SENSITIVE MATERIAL CONTAINING SILVER HALIDE, REDUCING AGENT AND POLYMERIZABLE COMPOUND AND CONTAINING CORE/SHELL GRAINS DOPED WITH IRIDIUM

FIELD OF THE INVENTION

This invention relates to a light-sensitive material comprising a light-sensitive layer containing silver halide, a reducing agent, a polymerizable compound and a color image forming substance provided on a support.

BACKGROUND OF THE INVENTION

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time.

An improved image forming method employing a dry process is described in Japanese Patent Provisional Publication Nos. 61(1986)-69062 and 61(1986)-73145 (the contents of both publications are described in U.S. Pat. No. 4,629,676. In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized in the portion where a latent image of the silver halide has been formed.

Further, Japanese Patent Provisional Publication No. 61(1986)-260241 describes another image forming method in which the polymerizable compound in a portion where a latent image of the silver halide has not been formed is polymerized. In the method, when the material is heated, the reducing agent functions as polymerization inhibitor in the portion where a latent image of the silver halide has been formed, and the polymerizable compound in the other portion is polymerized.

Japanese Patent Provisional Publication Nos. 61(1986)-275742 and 61(1986)-278849 describe an embodiment of the light-sensitive material, which employs microcapsules containing at least two components of the light-sensitive layer, that is polymerizable compound and a color image forming substance. The light-sensitive material having such a structure has an advantage of giving an image of high quality.

The light-sensitive material which contains a silver halide grain as a photosensor generally causes occurrence of fog in the unexposed area. The occurrence of the fog depends on characteristics of silver halide, or variation of the processing conditions such as heating temperature and humidity. Since the above image-forming method is performed using a heat development process at a high temperature, the occurrence of fog increases. Therefore, the contrast in the obtained image lowers.

Various methods have been heretofore proposed to keep the obtained image from fogging. A method in which the known compound as an anti-fogging agent is introduced at a stage of preparation of a silver halide emulsion is described in the above publications. It is known that silver halide grains having various grain forms (i.e., crystal structure) can be obtained by selecting the method for preparation and/or the silver halide composition. A silver halide grain reduced in the occurrence of fog can be obtained.

Various silver halide grains can be used to match with the desired light-sensitive material. A silver halide grain having a core/shell structure is employed in order to give an image which has a high sensitivity. However, when the silver halide grain having a core/shell structure is employed, the occurrence of fog is apt to increase. Accordingly, the quality of the image lowers.

The light-sensitive material comprising a light-sensitive layer containing a silver halide grain having a core/shell structure, and the silver iodide content in the shell is higher than that in the core has been filed by the present applicant (U.S. Ser. No. 012,462).

SUMMARY OF THE INVENTION

An object of the present invention is to provide a light-sensitive material which gives a clear image reduced in the occurrence of fog.

There is provided by the present invention a light-sensitive material comprising a light-sensitive layer provided on a support, wherein the light-sensitive layer contains a silver halide grain, a polymerizable compound, a reducing agent and a color image forming substance which are contained in microcapsules, said polymerizable compound and color image forming substance being contained in microcapsules, wherein the silver halide grain has a core-shell structure, at least 90 mole % of halogen of the silver halide in the shell portion of the silver halide grain is iodine, and the silver halide grain contains iridium ion in the range of from $10^{-7}$ to $10^{-3}$ mole based on one mole of the silver halide grain.

The light-sensitive material of the present invention contains the specific amount of iridium ion in the silver halide grain having the core/shell structure in which at least 90 mole % of halogen of the silver halide in the shell portion of the silver halide grain is iodine. Accordingly to the invention, the occurrence of fog is remarkably reduced.

According to the study of the present inventor, the silver halide grain having a core/shell structure in which at least 90 mole % of halogen of the silver halide in the shell portion of the silver halide grain is iodine has a defect in its crystal lattice. The defect in the crystal lattice becomes a fogging nucleus and causes the occurrence of fog. By the incorporation of iridium ion, the iridium ion is introduced into the silver halide grain at the stage of the grain formation, whereby the product of the fogging nucleus is minimized since the occurrence of the defect in the crystal lattice is reduced.

Accordingly, the light-sensitive material of the present invention can give an improved clear image having a high maximum density and a low minimum density.

DETAILED DESCRIPTION OF THE INVENTION

In the light-sensitive material of the present invention, a water soluble iridium salt can be employed by selecting from the known iridium compound.

The water soluble iridium salt preferably employed in the present invention has the following formula (I) or (II):

$$(R)_m IrX_6 \quad (I)$$

$$Ir(X)_n \quad (II)$$

in which R is a monovalent anion selected from the anions consisting of a hydrogen ion, a sodium ion, a potassium ion and an ammonium ion; X is halogen ion; m is 2 or 3; and n is 3 or 4.

Preferred examples of the water soluble iridium salts include $(NH_4)_3IrCl_6$, $(NH_4)_2IrCl_6$, $Na_3IrCl_6$ and $IrCl_3$.

The silver halide grain containing iridium ion can be prepared by adding the above water soluble iridium ion at the stage of the preparation of the silver halide grain. The iridium ion is contained in the amount of $10^{-7}$ to $10^{-3}$ mole based on one mole of the silver halide grain. The iridium ion is preferably present in an inner portion and/or or a surface portion of the silver halide grain.

In the case that the iridium ion is contained in the amount of not more than $10^{-7}$ mole, the expected effect cannot be obtained. In the case that the iridium ion is contained in the amount of not less than $10^{-3}$ mole, the sensitivity is reduced or the development rate decreases. The iridium salt is added in an amount of slightly more than that of the light-sensitive material in the conventional art ($10^{-8}$ to $10^{-3}$ mole based on one mole of the of silver), because the light-sensitive material of the invention is employed for the dry process.

The iridium salt is used in the form of an aqueous solution, or if desired, in a solution of an organic solvent such as methanol or in a mixture solution of water and an organic solvent. In any case, excess halogen ion preferably coexist in order to keep the stability of the prepared solution at a high level.

The silver halide grain employable for the light-sensitive material of the present invention has a core/shell structure.

In the present specification, "core/shell structure" means a structure in which the halogen composition in the silver halide grain is not uniform from the center to the surface of the grain.

Examples of the silver halide grain having the core/shell structure is a grain having a multilayer structure formed in the grain formation, which is described in Japanese Patent Provisional Publication Nos. 57(1982)-154232, 58(1983)-108533, 59(1984)-48755 and 59(1984)-52237, U.S. Pat. No. 4,433,048 and European Pat. No. 100,984). Another example of the silver halide grain having a uniform halogen composition to convert the surface halogen composition of the grain, which is described in Japanese Patent Provisional Publication No. 52(1977)-18309, and U.S. Pat. Nos. 3,622,318 and 3,703,584.

The multilayer structure of the grain generally is a double layer structure. In the case that the silver halide grain has the double layer structure, the outer part referred to as "shell", and the inner part is referred to as "core" in the specification.

The silver halide grain can have a triple or more layer structure. In this case, the outermost layer is referred to as "shell", and all of other portions are referred to as "core".

The shell is preferably present in the silver halide grain in the range of from 0.1 to 50% as on the silver content by weight.

The silver halide grain can have a structure in which the halogen composition continuously changes from the center to the surface of the grain, in addition to the multilayer structure. In this case, the outer portion in which 50 wt. % of the grain as the silver weight content is present is referred to as "shell", and the other inner portion is referred to as "core".

Examples of the silver halide grains having the core/shell structure employable in the invention include silver iodide, silver chloroiodide, silver iodobromide, and silver chloroiodobromide in the form of grains. The core portion may be composed of silver bromide or silver chloride. In the present invention, the silver halide has a halogen composition composed of two or more halides containing iodine. In these core/shell structures of the present invention, the iodide content of the silver halide in the shell is higher than that in the core.

The iodide content (per halide of the silver halide) in the shell portion is not less than 90 mole %, and more preferably is 100 mole %. The iodide content in the halide of the whole silver halide grain preferably is not more than 50 mole %.

The silver halide grain having the core/shell structure is liable to cause occurrence of the fog. Further, the silver halide itself in the shell is easier to develop than that in the core, and the occurrence of fog increases.

The occurrence of the fog is efficiently reduced by adding the iridium salt.

There is no specific limitation on grain size distribution of silver halide grains. The silver halide grains ordinarily have a mean grain (or particle) size of 0.001 to 5 μm, more preferably 0.001 to 2 μm.

There is no specific limitation on the crystal habit of the silver halide grain. Two or more kinds of silver halide grains which differ in crystal habit, grain size, and/or other features from each other can be used in combination.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 1 g/m², more preferably in the range of from 1 mg to 500 mg/m².

The silver halide grain is preferably contained in microcapsules together with the polymerizable compound (described hereinafter). Two or more microcapsules may be employed for a light-sensitive material to obtain a full color image. In this case, the light-sensitive material can be improved by adjusting the amount of the iridium ion which is contained in each of the microcapsules. The occurrence of the fog and the time required for development procedure are affected by many factors. The differences of the components contained in each of the microcapsules brought about the differences of the function among two or more microcapsules. Accordingly, the fogging is caused, and hence the light-sensitive material reduced in the occurrence of fog cannot be obtained.

Since the iridium ion of the present invention is used in each of the microcapsules by adjusting its amount, each of the microcapsules can be prepared in homogeneously. Accordingly, an improved light-sensitive material can be obtained. In the case that two or more microcapsules are employed as described above, the iridium ion may be incorporated into all of the microcapsules or some of them.

The iridium salt employed in the light-sensitive material of the present invention is one of the known compound which used to improve the high-intensify reciprocity failure. The efficiency for reducing the occurrence of the fog is pronounced.

The reducing agent, the polymerizable compound, the color image forming substance and the support which constitute the light-sensitive material of the invention are described below. Thus composed material is referred herein to as "light-sensitive material".

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending or the nature or amount of the reducing agent, the polymerizable compound within either an area where a latent image of the silver halide has been formed or an area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chiain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphthol, 2-(N-methyl-N-octadecylcarbomoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-tricholorphenyl)hydrazine, 1-{2-(2,5-di-tert-pentylphenoxy)butyloyl}-2-(p- or o-aminophenyl)-hydrazine, 1-{2-(2,5-di-t-pentylphenoxy)butyloyl}-2-(p- or o-aminophenyl)hydrazine pentadecylfluorocapyrlate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material of the invention are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentyglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

In the case that the color image forming substance comprises two components (e.g., color former and a developer), one component and the polymerizable compound is contained in the microcapsule, and the other component is arranged outside of the microcapsule in the light-sensitive layer, a color image can be formed on the light-sensitive layer.

In the light-sensitive material, a polymer image can be obtained on a support by polymerization.

The light-sensitive material of the present invention comprising a light-sensitive layer containing at least the polymerizable compound and the color image forming substance contained in the microcapsule.

The term "components contained in microcapsules" in the present specification means core materials which constitute microcapsules and/or components contained in the shell materials.

There is no specific limitation with respect to the microcapsules, various known manners can be employed (described hereinafter).

In the light-sensitive material of the invention, the silver halide and polymerizable compound are contained in microcapsules to form light-sensitive microcapsules which are dispersed in the light-sensitive layer. The reducing agent is preferably contained in the light-sensitive microcapsules. It is preferred that five or more silver halide grains are contained in the light-sensitive microcapsules. Further, the silver halide grains are preferably arranged in the shell of the microcapsules.

The light-sensitive material can be prepared by arranging a light-sensitive layer containing the above-mentioned components on a support. There is no limitation with respect to the support. In the case that a heat development is unilized in the use of the light-sensitive material, the support preferably is resistant to heat given in the processing stage. Examples of the material employable as the support include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less that 4 μm is observed in not more than 20 positions among 100 positions which are determined at random on a filtered waviness curve obtained according to JIS-B-0610. A surface of a paper support preferably has a low water absorptiveness of not more than 3 g/m$^2$ which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15% both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 646 mm$^2$ at pressure of 567 g. Furthermore, a paper support preferably has a pH value in the range of 5 to 9.

Various embodiments of the light-sensitive materials, optional components which may be contained in the light-sensitive layer, and auxiliary layers which may be optionally arranged on the light-sensitive materials are described below.

In the light-sensitive material of the invention, the polymerizable compound and the color image forming substance are contained in microcapsules to form light-sensitive microcapsules which are dispersed in the light-sensitive layer.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin containing polyamide resin and polyurea resin, a complex resin containing polyurethane resin and polyester resin.

In the case that the shell material is composed of a condensed aldehyde resin, the residual aldehyde preferably is not more than 5 mole based on the amount of the reducing agent.

The microcapsules which contains five or more silver halide grains are preferably more than 50% by weight based on the total amount of the microcapsules. The silver halide grains are preferably arranged in the shell material of the microcapsules.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The mean size of the microcapsule preferably ranges from 0.5 to 50 μm, more preferably 1 to 25 μm, most preferably 3 to 20 μm. The amount of the microcapsules having a particle size of not larger than one sixth part of the average particle size preferably is not more than 1 volume % of the total amount of the microcapsules. Further, the amount of the microcapsules having a particle size of not smaller than twice as large as the average particle size is not more than 1 volume % of the total amount of the microcapsules. Further more, the proportion of an average thickness of the shell of the microcapsules to the average particle size preferably ranges from $0.5 \times 10^{-2}$ to $5 \times 10^{-2}$.

The mean grain size of the silver halide grains preferably is not more than the 5th part of the mean size of the microcapsules, more preferably is not more than 10th part. It is observed that when the mean size of the microcapsules is not less than 5 times as much as the mean grain size of silver halide grains, even and uniform image can be obtained.

The light-sensitive layer can further contain optional components such as sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, anti-irradiation dyes or pigments, matting agents, antismudging agents, plasticizers, water releasers, binders, photo polymerization initiator, solvent of the polymerizable compound and water soluble vinyl polymers.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

The sensitizing dye is preferably added during the stage of the preparation of the silver halide emulsion.

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Examples of the radical generators include triazene-silver, silver diazotate and an azo compound.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The base or base precursor can be arranged outside of the microcapsules containing the components of the light-sensitive layer, such as silver halide and polymerizable compound. In this case, the base or base precursor preferably is a hydrophobic compound having melting point of 80° to 180° C. in the form of solid particles.

A base precursor can be used in combination with a catalyst for decomposing the base precursor. For example, a propiolate type base precursor can be used in combination with a catalyst such as silver, copper, a silver compound and a copper compound. Further, the propiolate type base precursor or a sulfonylacetate type base precursor can be used in combination with a hot-melt solvent, which functions as a catalyst for decomposing the base precursor.

In the light-sensitive material, the silver halide, the reducing agent, the polymerizable compound and the color image forming substance are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in the microcapsules under a condition that the base or base precursor is dissolved or dispersed in an aqueous solution of a water retention agent, or under a condition that the base or base precursor is adsorbed on solid particles. The base or base precursor contained in the microcapsules preferably has a melting point in the range of 70° to 210° C.

The base or base precursor can be contained in a layer different from the light-sensitive layer. Further, the base or base precursor can be contained in a porous support.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative, an acetylene compound, a sulfonamide derivative and a quarternary ammonium salt.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26–28 (December 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisiso-butyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The dyes or pigments can be contained in the light-sensitive layer for the purpose of anti-halation or anti-irradiation. Further, white pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991 and cellulose particles, and inorganic particles such as particles of talc, kaolin, bentonite, agalmatolite, zinc oxide, titanium dioxide or alumina described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water soluble polyvinyl compounds e.g., polyvinyl alcohol, polyvinylpyrrolidone, and acrylamide polymers, In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

In the case that the solvent of the polymerizable compound is used, the solvent is preferably contained in a microcapsule which is different from the light-sensitive microcapsule.

In the case that the water soluble vinyl polymer is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9–15 (June 1978). The light-sensitive layer preferably has a pH value of not more than 7.

Examples of auxiliary layers which are optionally arranged on the light-sensitive material include an image-receiving layer, a heating layer, an antistatic layer, an anticurl layer, a release layer, a cover sheet or a protective layer and an antihalation layer (colored layer).

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer. The details of the image-receiving layer will be described later.

Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The iridium salt is preferably introduced in the course of the stage of the preparation of the silver halide emulsion to obtain the silver halide grain containing iridium ion of the invention.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivative; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water soluble iridium salt, e.g., iridium (III) or (IV) chloride, or ammonium hexachloroiridate, or a water soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added in the course of the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound" includes the photo polymerizable composition and photo polymerizable compound) is used as the medium for preparation of the liquid composition containing another component of the light-sensitive layer. For example, the silver halide, (including the silver halide emulsion), the reducing agent, the photo polymerization initiator or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Instead of employing the above polymer, the light-sensitive composition can be prepared by dispersing the microcapsules having the silver halide emulsion as core material in the emulsion of the polymerizable compound.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

Examples of the process for preparation of the microcapsules include a process utilizing coacervation of hydrophilic wall-forming materials as described in U.S. Pat. Nos. 2,800,457 and 2,800,458; an interfacial; polymerization process as described in U.S. Pat. No. 3,287,154, U.K. Pat. No. 990,443 and Japanese Patent Publications Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or Urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

The preparation of the microcapsule containing the base or base precursor has been mentioned above. The prepared microcapsule can be added to the coating solution at an optional stage.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

Instead of bases or base precursors contained in the light-sensitive material, the development can be proceeds simultaneously or thereafter the bases or base precursors added to the light-sensitive layer. A base sheet (a sheet in which a base is contained) is preferably employed.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow.

Examples of the material employable as the support of the image-receiving material include baryta paper in addition to various examples which can be employed as the support of the known light-sensitive material. In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. There is no specific limitation with respect to the thermoplastic compound. The thermoplastic compound include known plastic resin and wax. The thermoplastic resin preferably has a glass transition temperature of not more than 200° C. The wax preferably has a melting point of not more than 200° C.

A photopolymerization initiator or a thermalpolymerization initiator can be contained in the image-receiving layer to polymerize the transferred unpolymerized polymerizable compound, so that the obtained image is fixed on the image-receiving layer.

A dye or pigment can be contained in the image-receiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer containing a granulated thermoplastic compound can be also provided on the image-receiving layer.

A layer containing an adhesive and a release paper can be provided in the order on the support of the image-receiving material on the opposite side of the image-receiving layer.

After the image exposure and/or the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewize exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating with light, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of Silver Halide Emulsion

In 1,000 ml of water were dissolved 20 g of gelatin, 1 g of potassium bromide and 10 mg of the following compound (a), and the resulting gelatin solution was adjusted to a pH of 3.8 using 1N sulfuric acid and was kept at 70° C. To the gelatin solution, 70 g of an aqueous solution containing 70 g of potasisium bromide and 3.0 of a water soluble iridium salt ($K_3IrCl_6$) and 600 ml of an aqueous solution containing 0.59 mole of silver nitrate were added simultaneously at the same feed rate over 50 minutes. Further, after 5 minutes, to the resulting mixture were added 100 ml of an aqueous solution containing 3.9 g of potassium iodide and 100 ml of an aqueous solution containing 0.01 mole of silver nitrate simultaneously at the same feed rate over 5 minutes. Thus, a silver iodobormide emulsion having tetradecahedral grains, uniform grain size distribution, a mean grain size of 0.25 μm and a core/shell structure was obtained.

(Compound (a))

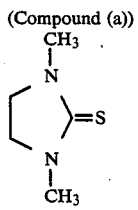

The emulsion was washed for desalting, and to the emulsion was added 54 ml of 1% methanol solution of the following sensitizing dye (a) to obtain a silver halide emulsion (A). The yield of the emulsion was 600 g.

(Sensitizing dye (a))

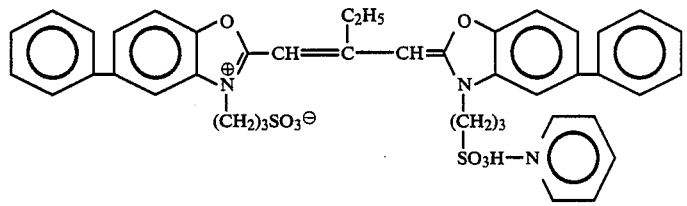

Preparation of Silver Benzotriazole Emulsion

In 3,000 ml of water were dissolved 28 g of gelatin and 20 g of benzotriazole, and the solution was kept at 40° C. while stirring. To the solution was added 100 ml of an aqueous solution containing 17 g of silver nitrate for 2 minutes. Excess salts were sedimented and removed from the resulting emulsion by pH-adjustment. Thereafter, the emulsion was adjusted to a pH of 7.0 to obtain a silver benzotriazole emulsion. The yield of the emulsion was 400 g.

Preparation of Light-Sensitive Composition

In the mixture of 90 g of trimethylolpropane triacrylate (tradename M-309 produced by Toa Gosei Chemical Industry Co., Ltd.) and 10 g of bisphenol A derivative acrylate (tradename M-210 produced by Toa Gosei Chemical Industry Co., Ltd.) were dissolved 0.40 g of the following copolymer and 14 g of Pargascript Red I-6-B (product, Ciba-Geigy)).

(Copolymer)

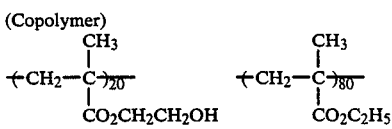

To 18.00 g of the resulting solution was added a solution in which 0.4 g of the following surface active agent, 0.5 g of the following reducing agent (I) and 1.0 g of the following reducing agent (II) are dissolved in 3.2 g of methylene chloride to obtain an oily phase (O).

(Surface active agent)

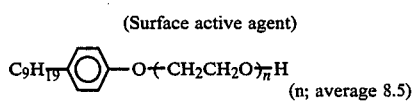

(Reducing agent (I))

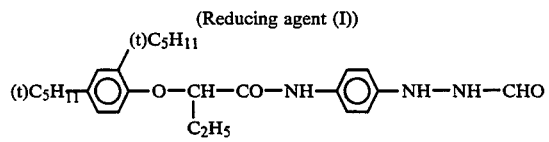

(Reducing agent (II))

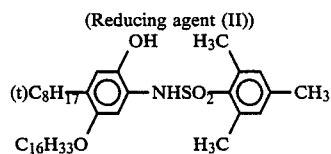

To 1.5 g of the silver halide emulsion (A) were added 0.4 g of 10% aqueous solution of potassium bromide and 20 mg of silver benzotriazole emulsion to obtain an aqueous phase (W).

Further, to the oily phase (O) was added the aqueous phase (W), and the mixture was stirred at 15,000 r.p.m. using homogenizer for 5 minutes to obtain W/O emulsion.

Preparation of Light-Sensitive Microcapsule

To 5% aqueous solution of partial sodium salt of polyvinylbenzene sulfonic acid (tradename VERSA TL 500 produced by National Starch, Co.) was added 20% aqueous solution of phosphoric acid, and adjusted to pH 3.5. To the aqueous solution was added the W/O emulsion in which 0.9 g of an adduct of xylene diisocyanate and trimethylolpropane (tradename Takenate D11ON produced by Takeda Chemical Industries, Ltd.) was dissolved, and stirred at 7,500 r.p.m. for 30 minutes using homogenizer at 40° C. to obtain an emulsion in which oildroplets having an average particle diameter of 6 $\mu$m were dispersed.

Independently, the mixture of 13 g of melamine, 22 g of 37% aqueous solution of formaldehyde and 71 g of water was stirred at 60° C. for 30 minutes to give a transparent melamine-formaldehyde precondensate.

To the above W/O/W emulsion was added 8 g of the precondensate. The mixture was then adjusted to pH 6.0 using 20% aqueous solution of phosphoric acid, and then was stirred for 90 minutes at 60° C. to obtain a dispersion (A) containing a shell material comprising melamine-formaldehyde resin (average particle diameter: 6.2 $\mu$m). The proportion of the particle having a diameter larger than 10 $\mu$m was not more than 15 wt. %. The proportion of the particle having a diameter smaller than 3 $\mu$m was not more than 15 wt. %.

Preparation of Light-Sensitive Material

To 6.0 g of the microcapsule dispersion (A) was added 2.5 g of 10% aqueous solution (solvent: water/ethanol=50/50 as volume ratio) of guanidine trichloroacetate to obtain a coating solution. The coating solution was coated on a neutralized paper (comprising a coating layer containing calcium carbonate, titanium oxide and latex of styrene butadien rubber) having a basis weight of 70 g in coating amount 50 g/m$^2$ and dried at 45° C. to obtain a light-sensitive material (I).

EXAMPLE 2 to 10

Each of silver halide emulsions (B), (C), (D), (E), (F) and (G) was prepared in the same manner as in Example 1 except that the sort and the amount of the water soluble iridium salt was changed as indicated in Table 1.

A silver halide emulsion (H) was prepared in the same manner as in Example 1 except that the water soluble iridium salt was added by dissolving in an aqueous solution of gelatin.

A silver halide emulsion (I) was prepared in the same manner as in Example 1 except that the water soluble iridium salt was added by dissolving in combination with 3.9 g of potassium iodide.

A silver halide emulsion (J) was prepared in the same manner as in Example 1 except that the water soluble iridium salt was desalting and then added by dissolving in 10 ml of 1% aqueous solution of pottasium bromide previously adding of the sensitizing dye (a).

TABLE 1

| Silver halide emulsion | Water-soluble iridium salt | Amount (mg) | Amount (mole/1 mole of silver) |
|---|---|---|---|
| (A) | K$_3$IrCl$_6$ | 3.0 | 10$^{-5}$ |
| (B) | K$_3$IrCl$_6$ | 300.0 | 10$^{-3}$ |
| (C) | K$_3$IrCl$_6$ | 0.03 | 10$^{-7}$ |
| (D) | Na$_3$IrCl$_6$ | 2.8 | 10$^{-5}$ |
| (E) | (NH$_4$)$_3$IrCl$_6$ | 2.7 | 10$^{-5}$ |
| (F) | (NH$_4$)$_2$IrCl$_6$ | 2.6 | 10$^{-5}$ |
| (G) | IrCl$_3$ | 1.8 | 10$^{-5}$ |

Preparation of Light-Sensitive Material

Each of light-sensitive materials (II), (III), (IV), (V), (VI), (VII), (VIII), (IX) and (X) was prepared in the same manner as in Example 1 except that each of the silver halide emulsions (B) to (J) was used and each of the corresponding microcapsule dispersions (B) to (J) having a shell material comprising polyurea resin-melamineformaldehyde resin was used.

COMPARISON EXAMPLE 1 & 2

Preparation of Silver Halide Emulsion

Silver halide emulsions (K) & (L) were prepared in the same manner as in Example 1 except that the water soluble iridium salt (K$_3$IrCl$_6$) was not used, or the amount of the water soluble iridium salt was changed to 0.003 mg (10$^{-8}$ mole/1 mole of silver).

Preparation of Light-Sensitive Material

Each of light-sensitive materials (XI) & (XII) was prepared in the same manner as in Example 1 except that the silver halide emulsions (K) & (L) was used and the microcapsule dispersions (K) & (L) having a shell material comprising polyurea resin-melamine formaldehyde resin were used.

Preparation of Image-Receiving Material

To 125 g of water was added 11 g of 40% aqueous solution of sodium hexametaphosphate, and were further added 34 g of zinc 3,5-di-$\alpha$-methylbenzylsalicylate, 82 g of 55% slurry of calcium carbonate and 10 g of titanium oxide (tradename R-780 of Ishihara Sangyo Kaisha, Ltd.), followed by coarsely dispersing in a mixer. The coarse dispersion was then finely dispersed in Dynomill dispersing device. To 200 g of the resulting dispersion were added 12 g of 50% latex of SBR (styrene-butadiene rubber) and 77 g of 8% aqueous solution of polyvinyl alcohol, and the resulting mixture was made uniform. The mixture was then uniformly coated on a cast coated paper (produced by Sanyo pulp Co., Ltd.) having basis weight of 65 g/m$^2$ to give a layer having a wet thickness of 36 $\mu$m and dried to obtain an image-receiving material.

Evaluation of Light-Sensitive Materials

Each of the light-sensitive materials prepared in Examples 1 to 10 and Comparison Examples 1 & 2 was imagewise exposed to light using a tungstem lamp at 20,000 lux for 1/100 second through a filter in which density has been continuously changed, and then heated on hot plate at 140° C. for 20 to 50 seconds. Each of the exposed and heated light-sensitive materials was then combined with the image-receiving material and passed through press rolls at pressure of 600 kg/cm$^2$ to obtain a magenta positive image on the image-receiving material. The density of the obtained magenta positive image was measured using Macbeth's reflection densitometer.

The results are set forth in Table 2.

In the present invention, the increasing of occurrence of the fog attributes the reduction of the maximum density (Dmax). Accordingly, where the maximum density is high, the occurrence of fog is reduced.

TABLE 2

| Light-sensitive material | Dmax after development (passage of time) (seconds) | | | |
|---|---|---|---|---|
| | 20 | 30 | 40 | 50 |
| (I) | 1.36 | 1.32 | 1.21 | 1.03 |
| (II) | 1.35 | 1.34 | 1.32 | 1.28 |
| (III) | 1.36 | 1.28 | 1.15 | 0.89 |
| (IV) | 1.34 | 1.29 | 1.18 | 1.01 |
| (V) | 1.36 | 1.30 | 1.30 | 1.04 |
| (VI) | 1.35 | 1.31 | 1.20 | 1.02 |
| (VII) | 1.35 | 1.30 | 1.19 | 0.99 |
| (VIII) | 1.34 | 1.26 | 1.12 | 0.87 |
| (IX) | 1.36 | 1.31 | 1.22 | 1.05 |
| (X) | 1.34 | 1.28 | 1.15 | 0.95 |
| (XI) | 1.34 | 1.21 | 0.95 | 0.49 |
| (XII) | 1.35 | 1.22 | 0.97 | 0.50 |

It is apparent from the results in Table 2, the light-sensitive materials (I) to (X) of the present invention can give a clear image reduced in occurrence of the fog. In the light-sensitive materials (XI) & (XII), the maximum density decreased. In each of the light-sensitive materials, the development requires a lot of time according to the increase of the amount of the iridium ion. Accordingly, the amount of the iridium ion contained in the light-sensitive material (II) is the upper limit in practical use.

COMPARISON EXAMPLE 3

Preparation of Silver Halide Emulsion

In 1,000 ml of water were dissolved 14 g of gelatin, 2 g of potassium bromide and 10 mg of the compound (a) used in Example 1, and the resulting gelatin solution was adjusted to pH of 3.6 using 1N sulfuric acid and was kept at 70° C. To the gelatin solution, 700 ml of an aqueous solution containing 70 g of potasisium bromide and 3.9 g of potassium iodide and 700 ml of an aqueous solution containing 0.6 mole of silver nitrate were added simultaneously at the same feed rate over 50 minutes. Thus, a silver iodobormide emulsion having tetradecahedral grains, uniform grain size distribution and a mean grain size of 0.25 μm was obtained.

The emulsion was washed for desalting, and to the emulsion was added 54 ml of 1% methanol solution of the sensitizing dye (a) used in Example 1 to obtain a silver halide emulsion (M). Yield of the emulsion was 600 g.

COMPARISON EXAMPLE 4

Preparation of Silver Halide Emulsion

A silver halide emulsion (N) was prepared in the same manner as in Comparison Example 3 except that 3.0 mg ($10^{-5}$ mole/1 mole of silver) of the water soluble iridium salt was added by dissolving in combination with potassium bromide and potassium iodide.

Preparation of Light-Sensitive Material

Each of light-sensitive materials (XIII) & (XIV) was prepared in the same manner as in Example 1 except that each of the silver halide emulsions (M) & (N) was used and each of the corresponding microcapsule dispersions (M) & (N) was used.

Evaluation of Light-Sensitive Material

Each of the light-sensitive materials (XIII) & (XIV) was evaluated in the same manner as described above. The results are set forth in Table 3.

TABLE 3

| Light-sensitive material | Dmax after development (passage of time) (seconds) | | | |
|---|---|---|---|---|
| | 20 | 30 | 40 | 50 |
| (XIII) | 1.33 | 1.29 | 1.11 | 0.75 |
| (XIV) | 1.34 | 1.28 | 1.13 | 0.83 |

It is apparent from the results in Table 3, the light-sensitive material (XIII) having no core/shell structure and containing no iridium ion and the light-sensitive material (XIV) having no core/shell structure and containing iridium ion are not reduced in occurrence of the fog. The sensitivity of each of light-sensitive materials (XII) & (XIV) lowered in compared with the light-sensitive materials (I) to (XII), and are not preferred in practical use.

I claim:

1. A light-sensitive material comprising a support and a light-sensitive layer containing a silver halide grain, an ethylenically unsaturated polymerizable compound, a reducing agent and a color image forming substance, said polymerizable compound and color image forming substance being contained in microcapsules, wherein the silver halide grain has a core/shell structure, at least 90 mole % of the halogen of the silver halide in the shell portion of the silver halide grain is iodine, and the silver halide grain contains iridium ion in an amount of $10^{-7}$ to $10^{-3}$ mole based on one mole of the silver halide grain, said iridium ion being introduced into the silver halide in the form of a water soluble iridium salt having the formula (I) or (II):

$(R)_m IrX_6$     (I)

$Ir(X)_n$     (II)

wherein R is a monovalent anion selected from the group consisting of a hydrogen ion, a sodium ion, a potassium ion and an ammonium ion; X is a halogen ion; m is 2 or 3; and n is 3 or 4.

2. The light-sensitive material as claimed in claim 1, wherein the iridium ion is introduced into the silver halide in the form of a water soluble iridium salt at a stage of grain formation of the silver halide or after the grain formation, and the water soluble iridium salt is present in an inner portion or a surface of the silver halide grain.

3. The light-sensitive material as claimed in claim 1, wherein the iridium ion is introduced into the silver halide in the form of a water soluble iridium salt which is selected from the group consisting of $(NH_4)_3IrCl_6$, $(NH_4)_2IrCl_6$, $Na_3IrCl_6$ and $IrCl_3$.

4. The light-sensitive material as claimed in claim 1, wherein the silver halide grain has a silver iodide content in the shell portion being higher than that in the core portion.

5. The light-sensitive material as claimed in claim 1, wherein the halogen of the silver halide in the shell portion of the silver halide grain is iodine.

6. The light-sensitive material as claimed in claim 1, wherein the silver halide grain is silver iodobromide grain.

7. The light-sensitive material as claimed in claim 1, wherein the silver halide grain is contained in microcapsules.

8. The light-sensitive material as claimed in claim 1, wherein the silver halide grain has an average particle diameter in the range of 0.01 to 5 μm.

* * * * *